(12) United States Patent
Posat et al.

(10) Patent No.: US 7,564,638 B2
(45) Date of Patent: Jul. 21, 2009

(54) PREAMPLIFIER CIRCUIT AND METHOD FOR A DISK DRIVE DEVICE

(75) Inventors: Baris Posat, San Jose, CA (US); Kemal Ozanoglu, Palo Alto, CA (US); Alessandro Venca, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 178 days.

(21) Appl. No.: 11/438,850

(22) Filed: May 23, 2006

(65) Prior Publication Data

US 2006/0262446 A1 Nov. 23, 2006

Related U.S. Application Data

(62) Division of application No. 10/349,539, filed on Jan. 22, 2003, now Pat. No. 7,099,098.

(51) Int. Cl.
*G11B 5/02* (2006.01)
(52) U.S. Cl. .................. 360/67; 360/46; 360/68
(58) Field of Classification Search ............ None
See application file for complete search history.

(56) References Cited

U.S. PATENT DOCUMENTS

| 4,134,078 | A |   | 1/1979  | Arai et al.      |         |
|-----------|---|---|---------|------------------|---------|
| 4,939,478 | A | * | 7/1990  | Heimsch et al.   | 330/253 |
| 4,965,528 | A | * | 10/1990 | Okanobu          | 330/252 |
| 5,394,182 | A |   | 2/1995  | Klappert et al.  |         |
| 5,398,144 | A | * | 3/1995  | Brannon          | 360/67  |
| 5,515,005 | A |   | 5/1996  | Yoshioka et al.  |         |
| 5,552,742 | A | * | 9/1996  | Perkins          | 327/563 |
| 5,565,815 | A | * | 10/1996 | Klein            | 330/253 |
| 5,699,010 | A | * | 12/1997 | Hatanaka         | 327/563 |
| 5,933,055 | A | * | 8/1999  | Dosho            | 330/255 |
| 6,490,112 | B1| * | 12/2002 | Ranmuthu et al.  | 360/66  |
| 6,552,611 | B2| * | 4/2003  | Yamamoto         | 330/253 |
| 6,570,427 | B2| * | 5/2003  | Prentice         | 327/287 |
| 6,580,323 | B2| * | 6/2003  | Mateman et al.   | 330/252 |
| 6,667,842 | B2| * | 12/2003 | Comeau et al.    | 360/67  |
| 6,707,626 | B2|   | 3/2004  | Esumi et al.     |         |
| 7,088,981 | B2| * | 8/2006  | Chang            | 455/326 |
| 7,190,214 | B2| * | 3/2007  | Barnett et al.   | 327/563 |
| 2002/0089377 | A1 | * | 7/2002 | Hwang         | 330/252 |
| 2003/0128071 | A1 | * | 7/2003 | Nguyen et al. | 330/254 |
| 2005/0035817 | A1 | * | 2/2005 | Filoramo et al.| 330/2  |

OTHER PUBLICATIONS

European Search Report, EP 04 25 0285, dated Oct. 1, 2008.
Patent Abstracts of Japan, vol. 0092, No. 66 (E-352), Oct. 23, 1985 & JP 60 113509 A (Hitachi Seisakusho KK), Jun. 20, 1985 abstract.

* cited by examiner

*Primary Examiner*—Hoa T Nguyen
*Assistant Examiner*—Dismery E Mercedes
(74) *Attorney, Agent, or Firm*—Lisa K. Jorgenson; Andre M. Szuwalski

(57) ABSTRACT

An amplifying circuit and method are disclosed for amplifying electrical signals, such as electrical signals generated by the read head of a disk drive. The circuit includes a pair of cross-coupled differential amplifier circuits. Each differential amplifier circuit is asymmetric, including two input transistors of different transistor types. For instance, a first of the two input transistors of each differential amplifier circuit may be a bipolar transistor and a second of the two input transistors may be a field effect transistor. By utilizing asymmetric differential amplifier circuits, a relatively wider operating frequency range is obtained.

12 Claims, 3 Drawing Sheets

PREAMPLIFIER CIRCUIT AND METHOD FOR A DISK DRIVE DEVICE

CROSS-REFERENCE TO RELATED APPLICATION

This application is a Divisional Application of U.S. application for patent Ser. No. 10/349,539, filed Jan. 22, 2003 now U.S. Pat. No. 7,099,098, the disclosure of which is hereby incorporated by reference.

BACKGROUND OF THE INVENTION

1. Technical Field of the Invention

The present invention relates to signal amplification, and particularly to a preamplifier circuit for amplifying signals generated by the read head of a disk drive device.

2. Description of the Related Art

Most computer systems include one or more associated disk drives, which may be built internal or external to the computer system. Typically, disk drives have at least one rotating magnetic medium and associated head mechanisms that are carried adjacent the magnetic material. The heads are radially positionable to selectively write information to, or read information from, precise positions on the disk medium. Such disk drives may be, for example, hard disk drives, floppy drives, or the like.

The conventional disk drive recording technology is referred to as "longitudinal magnetic recording" in which data is stored longitudinally along the surface of the magnetic recording medium in predefined concentric tracks. Data is written to the conventional data disk by applying a series of signals to a write head according to the digital information to be stored on the magnetic disk media. The write head has a coil and one or more associated pole pieces that are located in close proximity to the disk media. As signals cause the magnetic flux to change in the head, the magnetic domains of the magnetic media along the surface of the disk are aligned in predetermined directions for subsequent read operations. Typically, a small space of unaligned magnetic media disposed longitudinally along the medium surface separates each magnetic domain transition to enable successive transitions on the magnetic media to be distinguished from each other.

More recently, perpendicular recording as been discussed as a mechanism for extending magnetic recording density beyond what is believed to be attainable using longitudinal magnetic recording. In perpendicular magnetic recording, the medium is magnetized perpendicularly to the plane of the medium. Perpendicular magnetic recording system utilizes magnetic anisotropy in a direction perpendicular to the disk plane in order to increase the linear recording density. With this perpendicular magnetic recording system, recording at a remarkably higher density can be performed than a longitudinal magnetic recording system in which magnetic anisotropy in its plane direction is utilized. This is because in the perpendicular magnetic recording system, the demagnetizing field at a magnetization reversal region is very small in principle, thus enabling to narrow the magnetization transition width.

Next generation hard disk drive systems may employ the perpendicular magnetic recording technology. As such, the disk drive systems may very well require disk drive circuitry, such as preamplifiers, to possess low corner frequencies (LCFs) on the order of a few hundred kilohertz and high corner frequencies (HCFs) as high as 1 GHz or so. Such requirements result in a preamplifier having a lower LCF by a factor of approximately five, relative to LCFs of existing preamplifiers utilized in longitudinal recording. This LCF reduction is necessary because the readback signal of perpendicular recording has much lower frequency contents compared to longitudinal recording (square wave-like waveform versus lorentzian pulse waveform for longitudinal recording). Increased HCF that approximately doubles the HCF values for preamplifier circuitry in longitudinal recording systems may be required as well due to the increased data rate requirements associated with perpendicular recording. What is needed, then, is a preamplifier circuit possessing the operating performance necessary to effectively function in future disk drives utilizing the perpendicular recording technology.

SUMMARY OF THE INVENTION

Embodiments of the present invention overcome shortcomings in prior disk drive preamplifier circuitry and satisfy a significant need for a preamplifier circuit having a relatively wide operating frequency range. According to an exemplary embodiment of the present invention, a preamplifier circuit includes a pair of cross-coupled differential amplifier circuits. Each differential amplifier circuit may be configured as an asymmetric differential pair. In other words, the differential pair may include a pair of transistors for receiving a differential signal that are of different transistor types relative to each other.

In particular, each differential amplifier circuit of the cross-coupled pair may include a field effect transistor and a bipolar transistor having an emitter terminal coupled to a drain terminal of the field effect transistor. By cross-coupling the differential amplifier circuits so that the field effect transistor of a first differential amplifier circuit and the bipolar transistor of the second differential amplifier circuit are coupled together, the preamplifier circuit may have a relatively low LCF (due to the field effect transistors) and a relatively high HCF (due to the bipolar transistors).

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
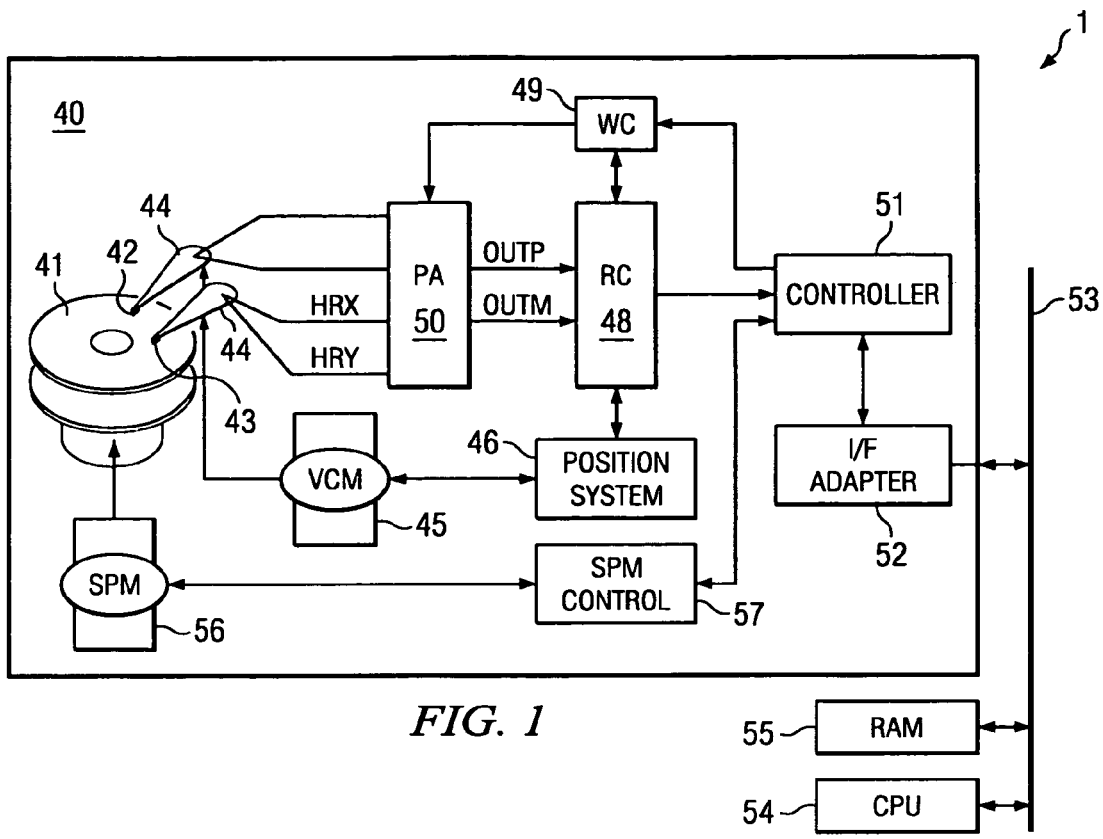
FIG. 1 is a block diagram of a system including a disk drive device according to an exemplary embodiment of the present invention.

Referring to FIG. 1, there is shown a block diagram of a data storage, information processing and/or computer system 1 including a disk drive 40 in accordance with the present invention. Disk drive 40 includes a storage medium in the form of one of more disks 41, each of which may contain data on both sides of the disk. Data is written to disks 41 using one or more write heads 42, and read therefrom by one or more read heads 43. Each write head 42 and read head 43 is connected to an arm 44 and is positionally controlled by a voice-coil motor ("VCM") 45 and a position system 46. The position system 46, through VCM 45, positionally maintains and/or moves write head 42 and read head 43 radially over the desired data on disks 41. A read channel 48 converts an analog read signal from read head 43 into digital form. A write channel 49 provides data in analog form to write head 42 for storing on a disk 41. A preamplifier 50 suitably conditions data read from and data to be written to disk 41. Channel controller 51 recognizes and organizes the digital data from the read channel 48 and digital data to be sent to write channel 49 into bytes of data.

An interface adapter 52 provides an interface between channel controller 51 and a system bus 53 that may be particular to the host (data storage, information processing and/or computer) system 1. The host system 1 will also typically have other devices that communicate on system bus 53, including a central processing unit ("CPU") 54 and volatile memory 55. A spindle motor ("SPM") 56 and SPM control circuit 57 rotate disk 41 and maintain disk 41 at the proper speed for performing a memory access operation (read or write operation). The SPM control circuit 57 may communicate with interface adapter 52 or controller 51, as shown in FIG. 1. It is understood that disk drive 40 may be divided into and/or include other function blocks from those shown in FIG. 1, and that the particular function block implementations illustrated in FIG. 1 are presented as an exemplary embodiment of the present invention.

Figure 2:
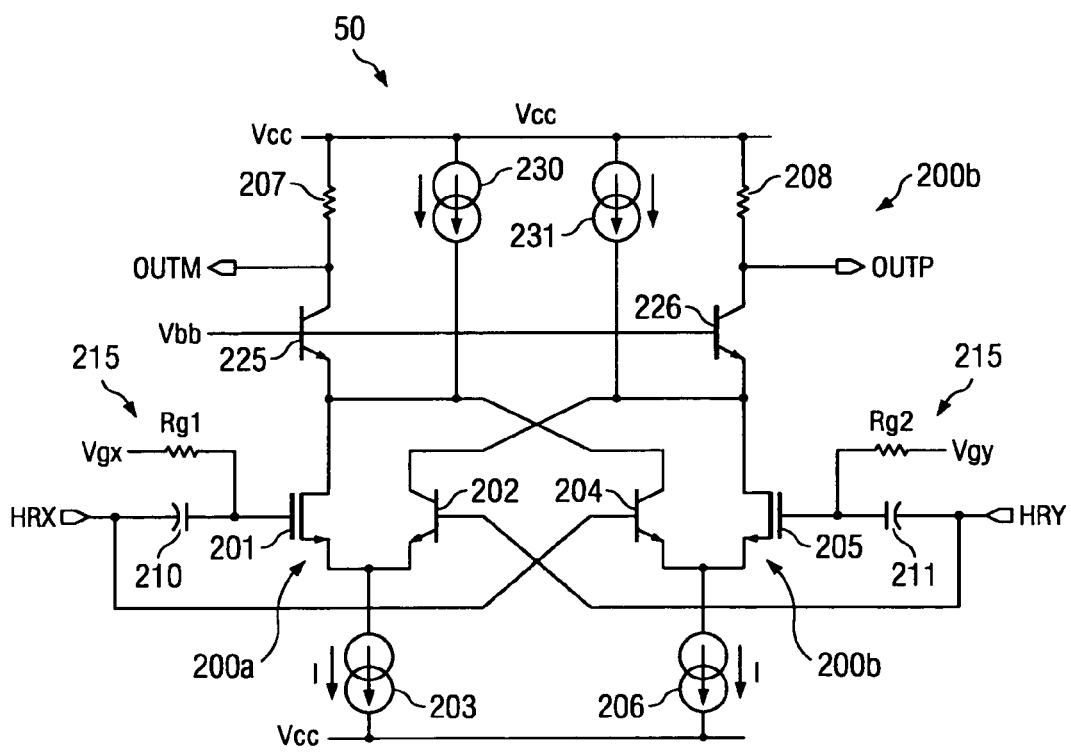
FIGS. 2 and 3 are transistor schematics of the preamplifier circuit of FIG. 1 according to the exemplary embodiment of the present invention.

FIG. 2 shows a schematic of the preamplifier 50 in accordance with an exemplary embodiment of the present invention. Preamplifier 50 may receive a differential signal appearing on a pair of differential signal lines HRX and HRY coupled to a read head 43, and generate a differential output signal appearing on differential signal lines OUTM and OUTP.

Preamplifier 50 may include a pair of cross-coupled differential amplifier circuits 200. Each differential amplifier circuit 200 may be configured as a differential pair, having a pair of transistors that are coupled at their respective control terminals to the differential input signal appearing on differential signal lines HRX and HRY. In particular, a differential amplifier circuit 200a may include a transistor 201 having a control terminal coupled to differential input signal line HRX, a transistor 202 having a control terminal coupled to differential input signal line HRY, and a current sink 203 coupled between transistors 201, 202 and the ground potential. Current sink 203 is adapted to sink a predetermined current level though transistors 201 and 202.

Similarly, a second differential amplifier circuit 200b may include a transistor 204 having a control terminal coupled to differential input signal line HRX and a transistor 205 having a control terminal coupled to differential input signal line HRY. A current sink 206 may be coupled between transistors 204, 205 and ground, and adapted to sink the predetermined current level through transistors 204 and 205.

Preamplifier 50 may include a load device 207, such as a resistor, coupled between a power supply voltage level, Vcc, and transistors 201 and 204, and a load device 208, such as a resistor, coupled between Vcc and transistors 202 and 205. Differential output signal lines OUTM and OUTP may be connected to load devices 207 and 208.

In order for preamplifier 50 to have an improved operating frequency range, with a lowered LCF and a relatively high HCF, each differential amplifier circuit 200 is a hybrid circuit and/or asymmetric in structure, by including transistors of different types. Specifically, transistor 201 may be a field effect transistor, such as MOSFET, and transistor 202 may be a bipolar transistor. Similarly, transistor 204 may be a bipolar transistor, and transistor 205 may be a field effect transistor, such as a MOSFET. It has been observed that the lowest noise and the highest gain of preamplifier 50 may be achieved if the transconductance of the field effect transistors 201 and 205 are substantially equal to the transconductance of the bipolar transistors 202 and 204.

Because field effect transistors possess nearly infinite input resistances, transistors 201 and 205 provide for improved low frequency performance. Preamplifier 50 is seen to have a lower LCF relative to the LCF of a preamplifier implemented with bipolar transistors. Because bipolar transistors have superior high frequency characteristics relative to field effect transistors, preamplifier 50 is seen to have a higher HCF relative to preamplifiers implemented with field effect transistors. By combining the low frequency characteristics of field effect transistors and high frequency characteristics of bipolar transistors, preamplifier 50 possesses both a relatively low LCF and a relative high HCF. Further, because preamplifier 50 includes two hybrid/asymmetric differential pairs for receiving the differential input signal in this manner, the net effect is that preamplifier 50 has a symmetrical structure. A symmetric structure advantageously provides relatively good power supply and common mode rejection.

Differential amplifier circuit 200a may further include a coupling capacitor 210 coupled between differential input signal line HRX and the control/gate terminal of transistor 201. Similarly, differential amplifier circuit 200b may include a coupling capacitor 211 coupled between differential input signal line HRY and the control/gate terminal of transistor 205. Coupling capacitors 210 and 211 block the DC bias voltage provided to differential input signal lines HRX and HRY.

Figure 3:
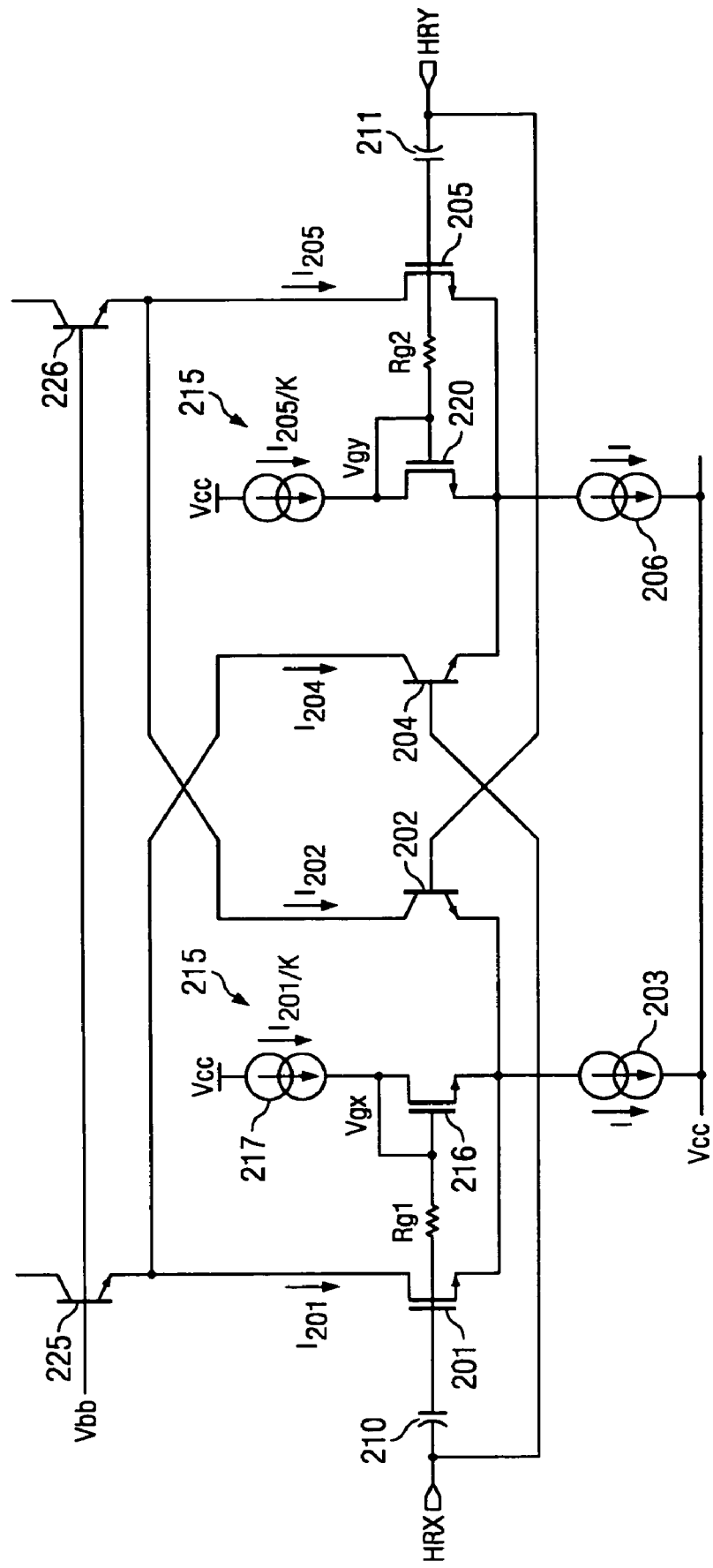

Preamplifier 50 may further include bias circuitry 215 for setting the operating voltage level of the gate terminals of transistors 201 and 205 and thereby establish the current distribution for the current sunk by current sinks 203 and 206. With reference to FIG. 3, there is shown preamplifier 50 including bias circuitry 215. Bias circuitry 215 may include a transistor 216 having its drain and gate terminal shorted together, and a source terminal coupled to the source terminal of transistor 201 and to the emitter of transistor 202. The size (width) of transistor 216 may be scaled relative to the size (width) of transistor 201. In this way, transistors 216 and 201 may form a current mirror such that the current passing through transistor 216 is proportional to the current passing through transistor 201 by the amount by which transistor 216 is scaled relative to transistor 201. A current source 217 may provide a predetermined current level to transistor 216. If the current passing through transistor 201 is I201, the current passing through transistor 202 is I202, and transistor 216 is scaled by k relative to transistor 201, the current Isink passing through current sink 203 may be seen to be represented as $$\text{Isink} = I201(1+1/k) + I202.$$

Bias circuitry 215 may further include a transistor 220 having its drain and gate terminal shorted together, and a source terminal coupled to the source terminal of transistor 205 and to the emitter of transistor 204. The size (width) of transistor 220 may be scaled relative to the size (width) of transistor 205. In this way, transistors 220 and 205 may form a current mirror such that the current passing through transistor 220 is proportional to the current passing through transistor 205 by the amount by which transistor 220 is scaled relative to transistor 205. A current source may provide a predetermined current level to transistor 220. If the current passing through transistor 205 is I205, the current passing through transistor 204 is I204, and transistor 220 is scaled by k relative to transistor 205, the current Isink passing through current sink 206 may be seen to be represented as Isink=$I205(1+1/k)+I204$.

Preamplifier 50 may further include cascode transistors 225 and 226. Transistors 225 and 226 may be bipolar transistors. Transistor 225 may have a collector terminal coupled to load device 207, and an emitter terminal coupled to the drain terminal of transistor 201 and the collector terminal of transistor 204. Transistor 226 may have a collector terminal coupled to load device 208, and an emitter terminal coupled to the drain terminal of transistor 205 and the collector terminal of transistor 202. The base terminal of transistors 225 and 226 may be coupled to a predetermined bias voltage level Vbb.

Preamplifier 50 may further include a current source 230 coupled to the drain terminal of transistor 201 and the collector terminal of 204 and adapted to provide a current to source part of the current provided to transistors 201 and 204. Further, a current source 231 may be coupled to the drain terminal of transistor 205 and the collector terminal of 202 and adapted to provide a current to source part of the current provided to transistors 205 and 202. In this way, the resistive values of load devices 207 and 208 (and thus the gain of differential amplifier circuits 200) may be increased.

Figure 4:
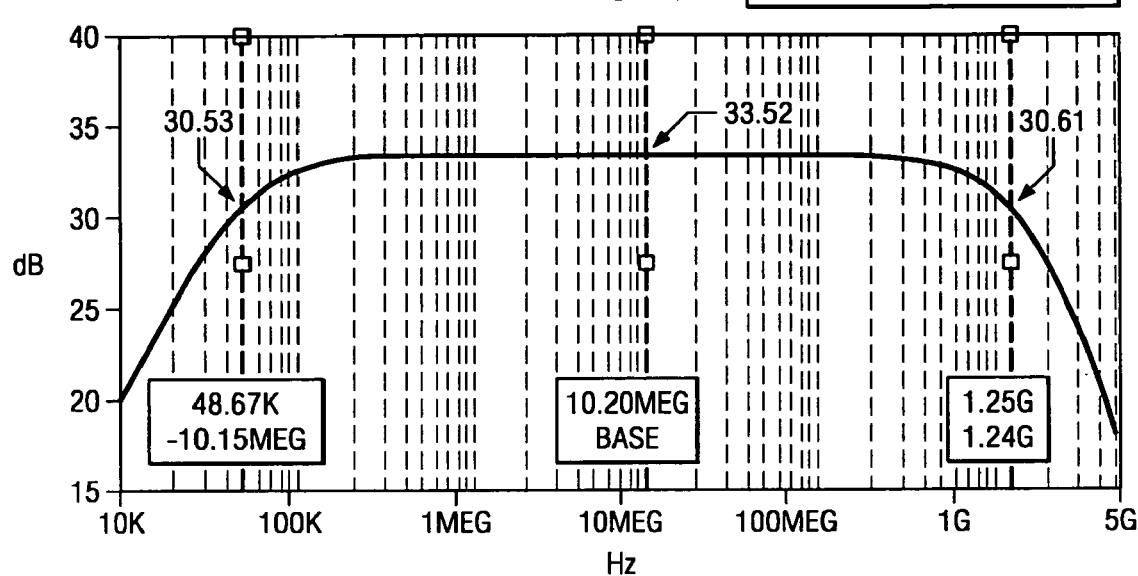
FIG. 4 is a plot illustrating the frequency response of the preamplifier circuits of FIGS. 2 and 3.
Figure 5:
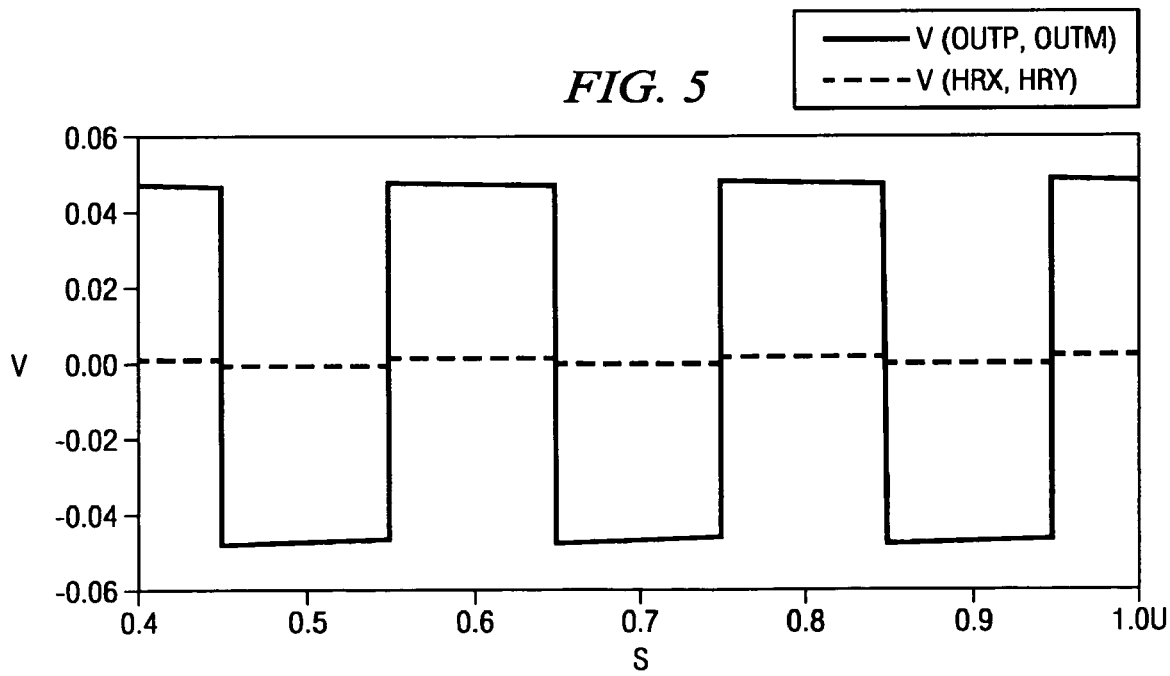
FIG. 5 is a plot illustrating the input-output voltage waveforms of the preamplifier circuits of FIGS. 2 and 3.

FIG. 4 is a simulation plot illustrating the frequency response of the preamplifier circuits of FIGS. 2 and 3. It is noted that both the LCF (approximately 48.7 KHz) and the HCF (approximately 1.25 GHz) are lower and higher, respectively, than that seen in existing preamplifier circuits utilized in longitudinal recording devices. FIG. 5 is a simulation plot of input voltage (HRX, HRY) and output voltage (OUTM, OUTP) of the preamplifier circuits of FIGS. 2 and 3.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. An amplifier circuit, comprising:
a first differential amplifier circuit, the first differential amplifier circuit being asymmetric with respect to transistor type and having a first pair of inputs and a first pair of outputs;
a second differential amplifier circuit, having a second pair of inputs and a second pair of outputs, the second pair of outputs coupled to the first pair of outputs of the first differential amplifier circuit, the second differential amplifier circuit being asymmetric with respect to transistor type;
wherein:
the first differential amplifier circuit comprises a first transistor of a MOS transistor type and a second transistor of a bipolar transistor type, the first and second transistors having control terminals coupled to first and second inputs, respectively; and
the second differential amplifier circuit comprises a third transistor of the MOS transistor type and a fourth transistor of the bipolar transistor type, the third and fourth transistors having control terminals coupled to the second and first inputs, respectively,
a first bias circuit coupled to the first differential amplifier circuit, for setting an operating condition of the first differential amplifier circuit; and
a second bias circuit coupled to the second differential amplifier circuit, for setting an operating condition of the second differential amplifier circuit,
wherein the first bias circuit comprises a first bias transistor connected in a current mirror configuration with the first transistor, and the second bias circuit comprises a second bias transistor connected in a current mirror configuration with the third transistor.

2. The circuit of claim 1, wherein a transconductance of the first transistor is substantially the same as a transconductance of the second transistor.

3. The circuit of claim 2, wherein a transconductance of the third transistor is substantially the same as a transconductance of the fourth transistor.

4. The circuit of claim 3, wherein the transconductance of the first transistor is substantially the same as the transconductance of the fourth transistor, and the transconductance of the second transistor is substantially the same as the transconductance of the third transistor.

5. The circuit of claim 1, further comprising:
a first capacitor connected between the first input and a control terminal of the first transistor; and
a second capacitor connected between the second input and a control terminal of the third transistor.

6. The circuit of claim 1, further comprising:
a first current source coupled to the first and second transistors so as to sink current passing through the first and second transistors; and
a second current source coupled to the third and fourth transistors so as to sink current passing through the third and fourth transistors.

7. The circuit of claim 1, further comprising:
a first resistive component coupled to the first and fourth transistors so as to source current passing through the first and fourth transistors; and
a second resistive component coupled to the second and third transistors so as to source current passing through the second and third transistors.

8. The circuit of claim 1, wherein the preamplifier circuit has a low corner frequency in hundreds of kilohertz and a high corner frequency of at least approximately 1 GHz.

9. An amplifier circuit, comprising:
a first differential amplifier circuit including first and second transistors, the first differential amplifier circuit being asymmetric with respect to transistor type and having a first pair of inputs and a first pair of outputs; and
a second differential amplifier circuit including third and fourth transistors, having a second pair of inputs and a second pair of outputs, the second pair of outputs coupled to the first pair of outputs of the first differential amplifier circuit, the second differential amplifier circuit being asymmetric with respect to transistor type;
a first bias circuit coupled to the first differential amplifier circuit, for setting an operating condition of the first differential amplifier circuit; and
a second bias circuit coupled to the second differential amplifier circuit, for setting an operating condition of the second differential amplifier circuit;
wherein: the first bias circuit comprises a first bias transistor connected in a current mirror configuration with the first transistor, and the second bias circuit comprises a second bias transistor connected in a current mirror configuration with the third transistor.

10. An amplifier circuit, comprising:
a first differential amplifier circuit, the first differential amplifier circuit being asymmetric with respect to transistor type and having a pair of inputs and a pair of outputs; and
a second differential amplifier circuit, having a pair of inputs coupled to the pair of inputs of the first differential amplifier circuit and a pair of outputs coupled to the pair of outputs of the first differential amplifier circuit, the second differential amplifier circuit being asymmetric with respect to transistor type;
wherein:
   the first differential amplifier circuit comprises a first transistor of a first transistor type and a second transistor of a second transistor type, the first and second transistors having control terminals coupled to the pair of inputs of the first differential amplifier circuit; and
   the second differential amplifier circuit comprises a third transistor of the first transistor type and a fourth transistor of the second transistor type, the second and third transistors having control terminals coupled to the pair of inputs of the second differential amplifier circuit;
and further comprising:
   a first resistive component coupled to the first and fourth transistors so as to source current passing through the first and fourth transistors;
   a second resistive component coupled to the second and third transistors so as to source current passing through the second and third transistors;
   a fifth transistor connected between the first resistive element and the first and fourth transistors, a control terminal of the fifth transistor being coupled to a reference voltage level; and
   a sixth transistor connected between the second resistive element and the second and third transistors, a control terminal of the sixth transistor being coupled to the reference voltage level.

11. An amplifier circuit, comprising:
a first differential amplifier circuit, the first differential amplifier circuit being asymmetric with respect to transistor type and having a pair of inputs and a pair of outputs; and
a second differential amplifier circuit, having a pair of inputs coupled to the pair of inputs of the first differential amplifier circuit and a pair of outputs coupled to the pair of outputs of the first differential amplifier circuit, the second differential amplifier circuit being asymmetric with respect to transistor type;
wherein:
   the first differential amplifier circuit comprises a first transistor of a first transistor type and a second transistor of a second transistor type, the first and second transistors having control terminals coupled to the pair of inputs of the first differential amplifier circuit; and
   the second differential amplifier circuit comprises a third transistor of the first transistor type and a fourth transistor of the second transistor type, the second and third transistors having control terminals coupled to the pair of inputs of the second differential amplifier circuit;
and further comprising:
   a first resistive component coupled to the first and fourth transistors so as to source current passing through the first and fourth transistors;
   a second resistive component coupled to the second and third transistors so as to source current passing through the second and third transistors;
   a first current source coupled to the first and fourth transistors so as to provide a predetermined current thereto; and
   a second current source coupled to the second and third transistors so as to provide a predetermined current thereto.

12. An amplifier circuit, comprising:
a first differential amplifier circuit, the first differential amplifier circuit having a first pair of inputs and a first pair of outputs and comprising a first transistor of a MOS transistor type and a second transistor of a bipolar transistor type; and
a second differential amplifier circuit, having a second pair of inputs and a second pair of outputs, the second pair of outputs coupled to the first pair of outputs of the first differential amplifier circuit, the second differential amplifier circuit comprising a third transistor of the MOS transistor type and a fourth transistor of the bipolar transistor type;
a first bias circuit coupled to the first differential amplifier circuit, for setting an operating condition of the first differential amplifier circuit; and
a second bias circuit coupled to the second differential amplifier circuit, for setting an operating condition of the second differential amplifier circuit;
wherein: the first bias circuit comprises a first mirror transistor having a common control terminal connection with the control terminal of the first transistor of the MOS type which forms a current mirror with the first transistor, and the second bias circuit comprises a second mirror transistor having a common control terminal connection with the control terminal of the third transistor of the MOS type which forms a current mirror with the third transistor.

* * * * *